United States Patent [19]

Suzuki

[11] Patent Number: 4,959,610
[45] Date of Patent: Sep. 25, 1990

[54] MAGNETIC RESONANCE APPARATUS

[75] Inventor: Yoshinori Suzuki, Yokohama, Japan

[73] Assignee: Kabushiki Kaisha Toshiba, Kawasaki, Japan

[21] Appl. No.: 394,675

[22] Filed: Aug. 16, 1989

[30] Foreign Application Priority Data

Sep. 30, 1988 [JP] Japan .................................. 63-246456

[51] Int. Cl.$^5$ .............................................. G01R 33/20
[52] U.S. Cl. .................................. 324/309; 364/413.13
[58] Field of Search ............... 324/307, 309, 312, 313, 324/314; 382/43; 364/413.13, 725, 727

[56] References Cited

U.S. PATENT DOCUMENTS 4,609,872  9/1986  O'Donnell ............................ 324/309
4,689,567  8/1987  Maudsley ............................ 324/309

OTHER PUBLICATIONS

Journal of Magnetic Resonance 80, 162-167, (1988), Bolinger et al., Oct. 15, 1988.
Journal of Magnetic Resonance 66, 283-294; R. J. Ordidge et al., Feb. 1, 1986.
Journal of Magnetic Resonance 76, 155-161, S. Muller et al., Jan. 1988.

Primary Examiner—Michael J. Tokar
Assistant Examiner—Kevin D. O'Shea
Attorney, Agent, or Firm—Oblon, Spivak, McClelland, Maier & Neustadt

[57] ABSTRACT

A magnetic resonance apparatus acquires a magnetic resonance signal matrix as follows. While a gradient field is applied to an object to be examined, a plurality of selective inversion pulses having different frequencies as high-frequency fields are sequentially applied to the object. Thereafter, a non-selective excitation pulse as a high-frequency field is applied to the object without application of a gradient field. In addition, a magnetic resonance signal generated upon application of the non-selective excitation pulse is acquired. Such a series of sequences are repeated a plurality of times, while the frequencies of the selective inversion pulses are sequentially selected to cause a magnetization vector of a nuclear spin of an area corresponding to either of "−1" and "1" an Hadamard matrix to be inverted by each selective inversion pulse. Chemical shift information is obtained by transforming a magnetic resonance signal matrix thus acquired in an aligning direction of the magnetic resonance signal matrix by an inverse Hadamard transform, and transforming the transformed matrix in a time base direction by an inverse Fourier transform.

14 Claims, 9 Drawing Sheets

MAGNETIC RESONANCE APPARATUS

BACKGROUND OF THE INVENTION

1. Field of the Invention

The present invention relates to a magnetic resonance (MR) apparatus and, more particularly, to a magnetic resonance apparatus for obtaining the chemical shift information of a specific atomic nucleus in an object to be examined.

2. Description of the Related Art

As conventional methods of obtaining the chemical shift information of a specific nucleus in an object to be examined by utilizing a magnetic resonance method, localized spectroscopy (also called "one-point spectroscopy") disclosed in "BME Vol. 1, No. 3, pp. 169–180 and a chemical shift imaging method (also called "multi-point spectroscopy or phase encoding method") disclosed in "T. F. Budinger, Medical Magnetic Resonance Imaging and Spectroscopy, pp. 81–95, Society of Magnetic Resonance in Medicine, Berkely, Calif., 1986" and the like are known.

Localized spectroscopy is a method of obtaining the chemical shift information of one local area, i.e., one point upon one measurement. In this method, therefore, it takes a long period of time to obtain chemical shift information of a large number of points. For this reason, this method is not suitable for a purpose of obtaining data of large number of points of normal and morbid portions and comparing the obtained data as in the field of clinical diagnoses in medical treatments.

In contrast to this, according to the chemical shift imaging method, chemical information of a large number of points in a wide area can be imaged within a relatively short period of time. However, in the chemical shift imaging method, phase encoding for converting position information in an object to be examined into phase information of a (nuclear) magnetic resonance signal, i.e., an MR signal, is required in the course of acquisition of MR signal and an imaging process. For this reason, if a nuclide having a short T2 (transverse relaxation time) is processed, an MR signal is attenuated while the above phase encoding operation is performed, and an S/N (signal-to-noise ratio) of the MR signal or of chemical shift information obtained upon acquisition of the MR signal is decreased.

As described above, the localized spectroscopy as one of the conventional methods for obtaining chemical shift information is not suitable for a clinical purpose because it requires a long period of time to obtain the chemical shift information of a large number of points. The chemical shift imaging method as another conventional method for obtaining chemical shift information requires an extra time for phase encoding in the course of acquisition of an MR signal and an imaging process. Hence, the chemical shift information of a nuclide having a short T2 cannot be extracted at high S/N ratio.

Summary of the Invention

It is an object of the present invention to provide a magnetic resonance apparatus which can obtain the chemical shift information of a large number of points at once and which can obtain the chemical shift information of a nuclide having a short T2 at a high S/N ratio because phase encoding or the like is not required.

A magnetic resonance apparatus according to a first aspect of the present invention acquires an MR signal matrix as follows. While a gradient field is applied to an object to be examined, a plurality of selective inversion pulses having different frequencies as high-frequency fields are sequentially applied to the object. Thereafter, a non-selective excitation pulse as a high-frequency field is applied to the object without application of a gradient field. In addition, an MR signal generated upon application of the non-selective excitation pulse is acquired. Such a series of sequences are repeated a plurality of times, while the frequencies of the selective inversion pulses are sequentially selected to cause a magnetization vector (to be simply referred to as "magnetization" hereinafter) of a nuclear spin of an area corresponding to either of "−1" and "1" of an Hadamard matrix to be inverted by each selective inversion pulse. Chemical shift information is obtained by transforming an MR signal matrix thus acquired in an aligning direction of the MR signal matrix by an inverse Hadamard transform, and transforming the transformed matrix in a time base direction by an inverse Fourier transform.

A magnetic resonance apparatus according to a second aspect of the present invention comprises a first MR signal matrix acquiring section for repeating the same sequences as described above a plurality of times while sequentially changing the frequencies of selective inversion pulses so as to cause magnetization of areas corresponding to "−1" of an Hadamard matrix to be inverted by the respective selective inversion pulses, and a second MR signal matrix acquiring section for repeating the same sequences as described above a plurality of times while sequentially changing the frequencies of the selective inversion pulses so as to cause magnetization of areas corresponding to "1" of the Hadamard matrix to be inverted by the respective selective inversion pulses. A difference between MR signal matrices obtained by the first and second MR signal matrix acquiring sections is calculated. After a differential signal matrix based on the calculated difference is transformed in the aligning direction of the signal matrix by the inverse Hadamard transform, the transformed matrix is transformed in the time base direction by the inverse Fourier transform, thus obtaining chemical shift information.

Each selective inversion pulse to be used in the above-described sequences may be a single pulse, but preferably consists of a first selective excitation pulse having a frequency higher than a desired center frequency by a predetermined value and a second selective excitation pulse having a frequency lower than the center frequency by a predetermined value. In this case, a gradient field consists of a pair of gradient field pulses having opposite polarities which are respectively used when the first and second selective excitation pulses are applied.

In addition, according to the magnetic resonance apparatus of the present invention, selective excitation pulses for saturating the magnetization of areas other than an area of interest in an object to be examined from which magnetic resonance signals are acquired are preferably applied as high-frequency fields prior to execution of the above sequences, thereby performing three-dimensional positioning of the area of interest.

In the apparatus of the present invention, an MR signal matrix can be obtained from a rod-like area of interest corresponding to an Hadamard matrix as a matrix transformed by Hadamard transform. If this matrix is transformed in the aligning direction of the matrix by inverse Hadamard transform, signals from local areas having volumes corresponding to the elements of the Hadamard matrix can be separately obtained. If the resultant values are transformed in the time base direction by the inverse Fourier transform, chemical shift information of each local area can be obtained.

If the differential signal matrix based on the difference between the magnetic resonance signal matrices obtained by the first and second MR signal matrix acquiring sections is Hadamard-transformed, mixing of signals from the respective local areas with signals from other areas can be prevented, and area selectivity is improved.

If a pair of first and second selective excitation pulses respectively having frequencies higher and lower than a desired center frequency by predetermined values are used as a selective inversion pulse, and gradient field pulses having opposite polarities are respectively used as gradient fields when the first and second excitation pulses are applied, disturbance of spin due to a gradient field can be canceled. As a result, the area selectivity of a selective inversion pulse can be improved, and the detection sensitivity of an MR signal can be increased.

As described above, according to the apparatus of the present invention, MR signals from a plurality of local areas in a rod-like area of interest can be separately detected, and hence the chemical shift information of a large number of points can be obtained at once. Moreover, since phase encoding is not required, MR signals from the respective local areas can be separately obtained within a short period of time. Therefore, chemical shift information with a high S/N ratio can be obtained even from a nuclide having a short T2.

According to the apparatus of the present invention, therefore, chemical shift information from a large number of points can be obtained at once without a dead time required for phase encoding. For this reason, chemical shift information with a high S/N ratio can be obtained from a nuclide having a short transverse relaxation time T2, e.g., an ATP (adenosine triphosphate) or Pi (inorganic phosphorus) component.

BRIEF DESCRIPTION OF THE DRAWINGS

FIGS. 3A to 6B are views for explaining a series of sequences of MR signal acquisition in the embodiment in FIG. 1;

FIGS. 9A to 12B are views for explaining a series of sequences of MR signal acquisition by an MR apparatus according to a second embodiment of the present invention;

DETAILED DESCRIPTION OF THE PREFERRED EMBODIMENTS

Figure 1:
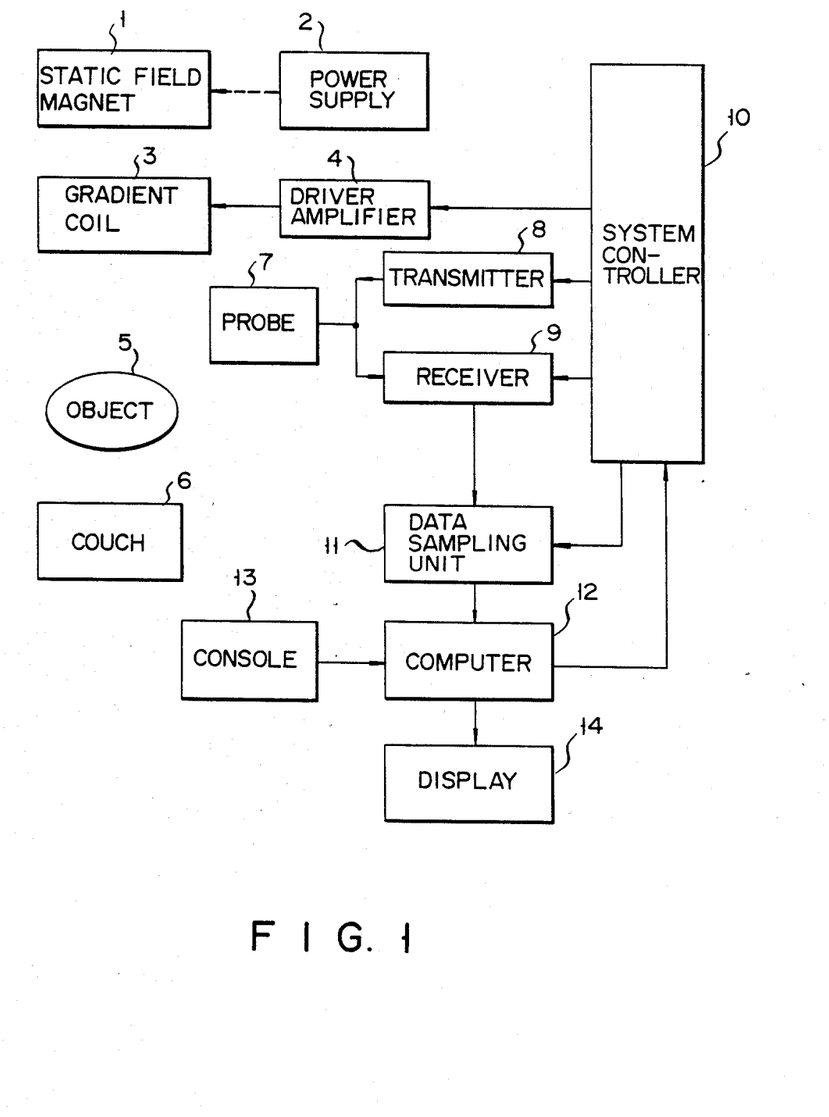
FIG. 1 is a block diagram showing an arrangement of an MR apparatus according to a first embodiment of the present invention.

FIG. 1 shows an arrangement of an MR apparatus according to a first embodiment of the present invention. The apparatus shown in FIG. 1 is designed as an MR medical diagnosing apparatus.

A static field magnet 1 and a gradient coil 3 are respectively driven by a power source 2 and a drive amplifier 4 so as to apply a uniform static field and a gradient field having a field intensity gradually changing in a predetermined direction onto an object 5 to be examined (e.g., a human body, i.e., a patient) on a couch 6. The power source 2 and the drive amplifier 4 are controlled by a system controller 10.

A high-frequency field is also applied from a probe 7 onto the object 5. The high-frequency field is generated by the probe 7 on the basis of a high-frequency signal output from a transmitting section 8 under the control of the system controller 10. In FIG. 1, the probe 7 is used as both a transmitting coil for generating a high-frequency field and a receiving coil for receiving an MR signal from the object 5. However, transmitting and receiving coils may be independently arranged.

When nuclear spin, i.e., magnetization of a specific atomic nucleus in the object 5 is excited by the high-frequency field, magnetic resonance occurs, and an MR signal based on the magnetic resonance is received by the probe 7.

The MR signal received by the probe 7 is amplified and detected by a receiving section 9 and is supplied to a data sampling unit 11. Data transmission from the receiving section 9 to the data sampling unit 11 is also performed under the control of the system controller 10. The data sampling unit 11 acquires the MR signal extracted by the receiving section 9, and samples and converts it into a digital signal by using an A/D converter. Thereafter, the unit 11 supplies the digital signal to a computer 12. The data sampling unit 11 is also operated under the control of the system controller 10.

The computer 12 is operated in accordance with a command supplied from an operator through a console 13. The computer 12 performs processing including an inverse Hadamard transform and an inverse Fourier transform of sampling data of an MR signal supplied from the data sampling unit 11 as will be described later, thereby obtaining the chemical shift information of an area of interest. In addition, the computer 12 controls the system controller 10. Chemical shift information obtained by the computer 12 is supplied to an image display 14 to be displayed.

A sequence for MR signal acquisition in the apparatus of this embodiment will be described with reference to FIGS. 2 and 3.

Figure 2A:
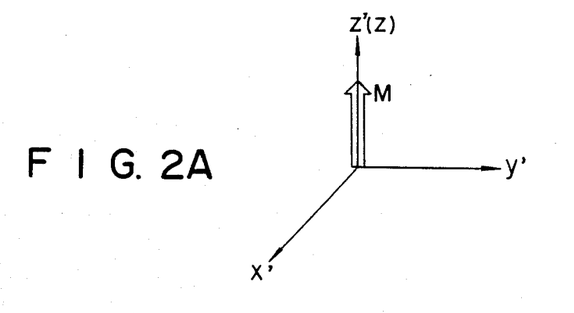
FIGS. 2A to 2C are views for explaining the principle of the first embodiment in FIG. 1.
Figure 2B:
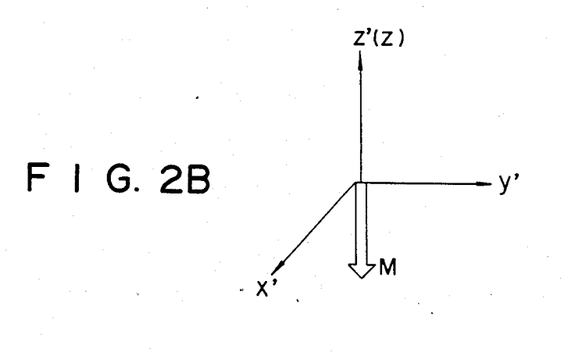

A magnetization vector ("magnetization") M of a nuclear spin in a static field is directed to the z' direction of a rotating coordinate system (x',y',z') rotating about the z-axis (i.e., to the z direction of an inertial coordinate system (x,y,z), as shown in FIG. 2A. If an inversion pulse (180° pulse) as a high-frequency field is applied to the above magnetization M, the magnetization M is rotated and directed to the -z direction, as shown in FIG. 2B.

Figure 2C:
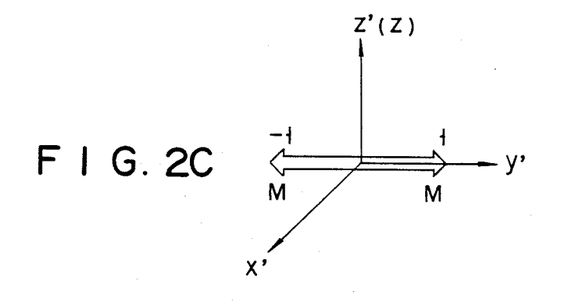

Upon application of a 90x° pulse directed to the x' direction of the rotating coordinate system (x',y',z'), the magnetization M is rotated about the x'-axis and is directed to the "−1" direction in FIG. 2C. The magnetization M which receives no inversion pulse is rotated about the x'-axis and is directed to the "1" direction in FIG. 2C. Therefore, the sign of an MR signal to be observed at this time is changed depending on whether it is generated by nuclear spin upon application of an inversion pulse or by nuclear spin without application of an inversion pulse.

Generally, an MR signal s(t) is given by the following equation:

$$s(t) = \int\int\int\int \rho(x,y,z,\omega)\exp[j\omega t]\cdot\exp[-t/T2(x,y,z,\omega)]dxdydzd\omega \quad (1)$$

$\rho(x,y)$: nuclear spin density
$\omega$: MR angular frequency
x,y,z: position
t: time If a selective excitation pulse is used for a high-frequency field, only the magnetization M of nuclear spin of a specific local area can be inverted.

An MR signal s(t) at this time can be represented by:

$$s(t) = \Sigma sgn(i)\int\int\int\int Ai\rho(z,y,z,\omega)\exp[j\omega t]\cdot\exp[-t/T2(x,y,z,\omega)]dxdydzd\omega \quad (2)$$

Ai: local area
sgn(i): sign function (−1 is assigned when the magnetization M of the local area Ai is inverted; and 1, when it is not inverted)

In addition, if an MR signal from the local area Ai is represented by fi, $$fi = \int\int\int\int Ai\rho(x,y,z,\omega)\exp[j\omega t]\cdot$$
$$\exp[-t/T2(x,y,z,\omega)]dxdydzd\omega, \text{ and}$$

$$s(t) = \sum_i sgn(i)fi$$

In this case, assuming that the magnetization M of only a local area corresponding to "−1" of an Hadamard matrix of an area of interest in an object to be examined is inverted, the following equation can be obtained:

$$sj(t) = \sum_i hij \cdot fi \quad (4)$$

hij: element of Hadamard matrix $$H = \begin{pmatrix} h11 & \ldots & h1n \\ . & & \\ . & & \\ . & & \\ hn1 & \ldots & hnn \end{pmatrix}$$

H: Hadamard matrix

In this case, if an MR signal is observed while the value j is changed from 1 to n, $$S = H \cdot F$$

S: signal matrix $$S = \begin{pmatrix} s1(t) \\ . \\ . \\ . \\ sn(t) \end{pmatrix}$$

F: area signal matrix $$F = \begin{pmatrix} f1(t) \\ . \\ . \\ . \\ fn(t) \end{pmatrix}$$

In this case, if the signal matrix S is transformed by the inverse Hadamard transform, $$\begin{aligned} D &= H^{-1}\cdot S \\ &= H^{-1}\cdot H\cdot F \\ &= F \\ &= \begin{pmatrix} s1(t) \\ . \\ . \\ . \\ sn(t) \end{pmatrix} \end{aligned} \quad (6)$$

thus obtaining a separate signal of each area.

In this manner, a selective inversion pulse is applied to an area of interest such that the arrangement pattern of a local area who magnetization M is inverted and a local area who magnetization M is not inverted in the area of interest corresponds to the pattern of the Hadamard matrix H, and an MR signal matrix represented by equation (5) thus obtained is transformed by the hadamard transform as represented by equation (6). As a result, separate MR signals can be obtained from the respective local areas. If the separate MR signal of each local area is transformed in the time base direction by the inverse Fourier transform, the MR spectrum (chemical shift information) of each local area can be obtained.

FIGS. 3A to 6B respectively show sequences of acquisition of MR signals (FID signals) Sig. by applying high-frequency fields RF and gradient fields G to four local areas A0 to A3 in a region of interest ROI (FIGS. 3A, 4A, 5A, and 6A), and inverted and non-inverted states of the nuclear spin magnetization M of the local areas A0 to A3 (FIGS. 3B, 4B, 5B, and 6B). Note that "−1" and "1" respectively represent inverted and non-inverted states. In this case, a series of sequences of MR signal acquisition is constituted by four sequences in FIGS. 3A, 4A, 5A, and 6A. In this case, the Hadamard matrix to which the inverted/non-inverted arrangement pattern of the local areas A0 to A3 is caused to correspond is of a fourth degree (4×4).

Figure 3A:
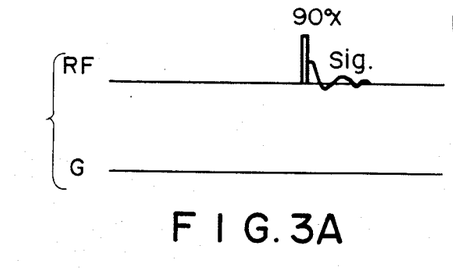
Figure 3B:
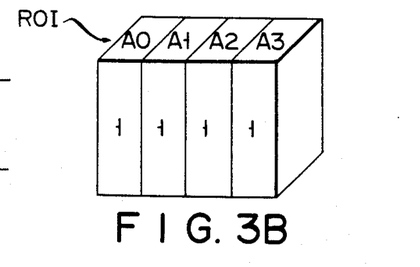

Since all the elements of the first row of this Hadamard matrix are "1", neither a selective inversion pulse as the high-frequency field RF nor the gradient field G are applied in the first sequence shown in FIG. 3A. In this case, since the magnetization of all the local areas A0 to A1 are not inverted, an FID signal Sig.=s1(t)

obtained immediately after application of a 90x° pulse which is a non-selective excitation pulse as a high-frequency field is equivalent to the sum of signals from the respective local areas A0 to A3 as follows:

$$s1(t) = f0(t) + f1(t) + f2(t) + f3(t)$$

Figures 4A, 4B:
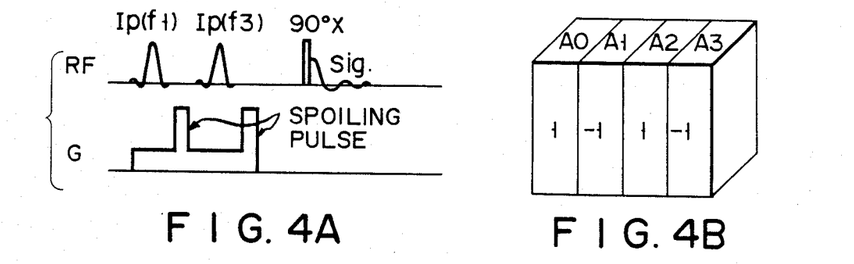

In the sequence shown in FIG. 4A, selective inversion pulses $I_P(f0)$ and $I_P(f3)$ whose frequencies are respectively set to invert the magnetization of the local areas A0 and A3 corresponding to "−1" of the second row of the Hadamard matrix H are applied together with a gradient field. Thereafter, a 90° pulse is applied. A signal $Sig. = s2(t)$ obtained at this time is:

$$s2(t) = f0(t) - f1(t) + f2(t) - f3(t)$$

Figures 5A, 5B:
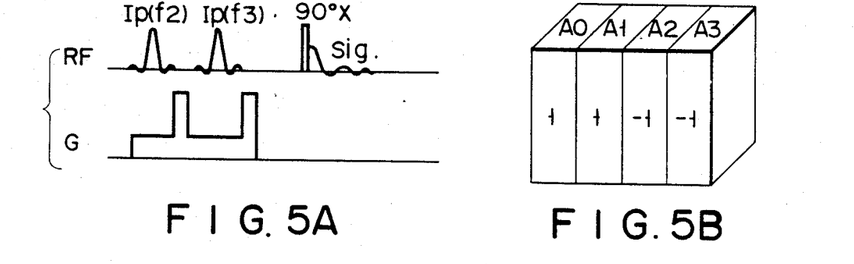
Figures 6A, 6B:
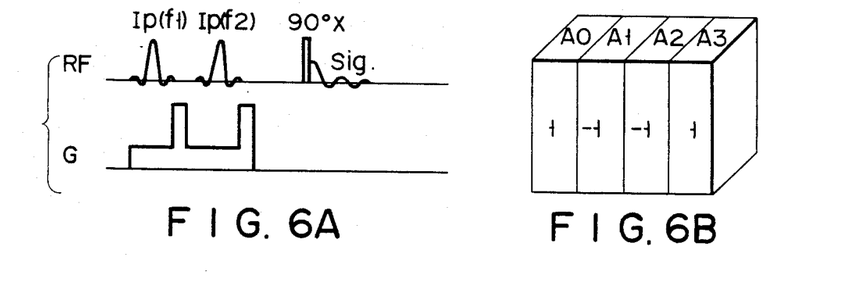

Similarly, in the sequence shown in FIG. 5A, selective inversion pulses $I_P(f2)$ and $I_P(f3)$ whose frequencies are respectively set to invert the magnetization of the local areas A2 and A3 corresponding to "−1" of the third row of the Hadamard matrix H are applied together with a gradient field pulse. Thereafter, a 90x° pulse is applied. In the sequence shown in FIG. 6A, selective inversion pulses $I_P(f1)$ and $I_P(f3)$ whose frequencies are respectively set to invert the magnetization of the local areas A1 and A3 corresponding to "−1" of the fourth row of the Hadamard matrix H are applied together with a gradient field pulse. Thereafter, a 90x° pulse is applied. In these sequences, the following signals are respectively obtained as a signal $Sig. = s3(t)$ and a signal $Sig. = s4(t)$:

$$s3(t) = f0(t) + f1(t) - f2(t) - f3(t)$$

$$s4(t) = f0(t) - f1(t) - f2(t) + f3(t)$$

In the respective sequences shown in FIGS. 3A, 4A, 5A, and 6A, MR signals are detected immediately after application of 90x° pulses without a dead time, and hence the signal of a nuclide having a short T2 can be obtained with little attenuation. An MR signal matrix S obtained by the series of sequences described above can be represented by the following equation:

$$S = \begin{pmatrix} 1 & 1 & 1 & 1 \\ 1 & -1 & 1 & -1 \\ 1 & 1 & -1 & -1 \\ 1 & -1 & -1 & 1 \end{pmatrix} \begin{pmatrix} f0(t) \\ f1(t) \\ f2(t) \\ f3(t) \end{pmatrix} = H \cdot F \quad (7)$$

In this case, if this MR signal matrix is subjected to the inverse Hadamard transform, the following equation can be established, and the signals of the respective local areas A0 to A3 are independently obtained as follows:

$$\begin{aligned} D &= H^{-1} \cdot S \\ &= \begin{pmatrix} 1 & 1 & 1 & 1 \\ 1 & -1 & 1 & -1 \\ 1 & 1 & -1 & -1 \\ 1 & -1 & -1 & 1 \end{pmatrix} \begin{pmatrix} 1 & 1 & 1 & 1 \\ 1 & -1 & 1 & -1 \\ 1 & 1 & -1 & -1 \\ 1 & -1 & 1 & 1 \end{pmatrix} \begin{pmatrix} f0(t) \\ f1(t) \\ f2(t) \\ f3(t) \end{pmatrix} \\ &= \begin{pmatrix} f0(t) \\ f1(t) \\ f2(t) \\ f3(t) \end{pmatrix} \end{aligned} \quad (8)$$

Figure 7A:
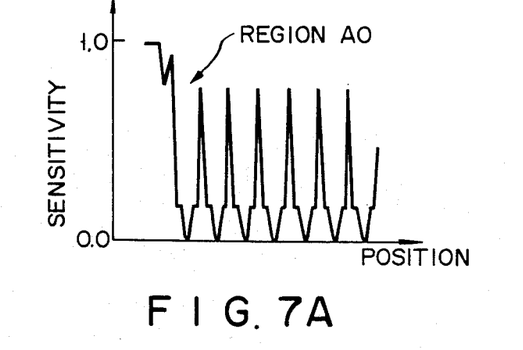
FIGS. 7A to 7C are graphs showing simulation results of detection sensitivities of MR signals from the respective local areas in the sequences shown in FIG. 3A, 4A, 5A, and 6A.
Figure 7B:
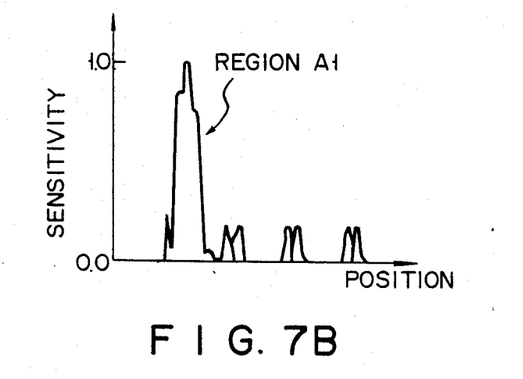
Figure 7C:
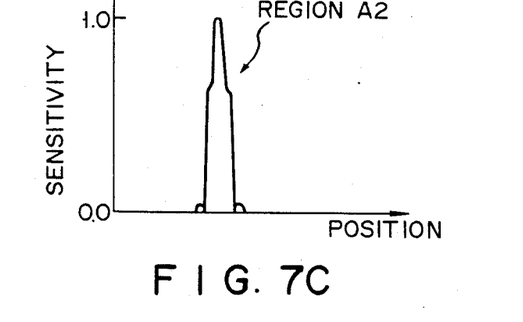

The detection sensitivities of MR signals detected from the three local areas A0, A1, and A2 of the eight local areas by using the sequences of MR signal acquisition described in the above embodiment are obtained by simulation. FIGS. 7A to 7C show the results. In this case, a selective inversion pulse has a sinc waveform which is normally used, and transverse magnetization is set to be zero by applying a spoiling gradient field pulse (see FIGS. 4A, 5A, and 6A) upon application of a selective inversion pulse. In addition, the motion of each nuclear spin is calculated according to the Bloch equation.

Figure 8:
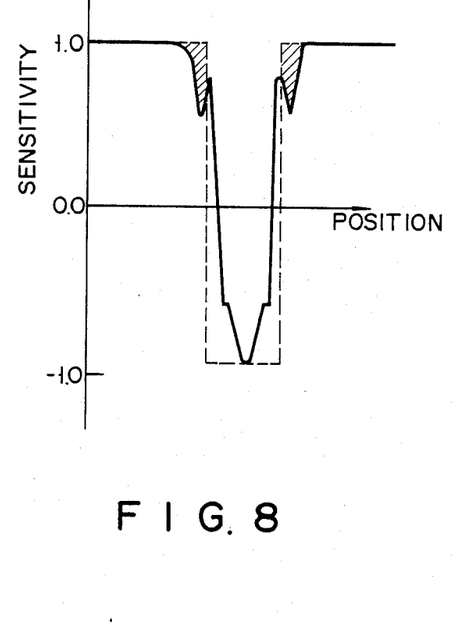
FIG. 8 is a graph showing ideal and actual characteristic curves of selection characteristics of a sinc waveform used as a selective inversion pulse.
Figure 9A:
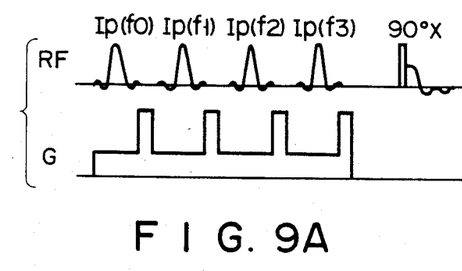
Figure 9B:
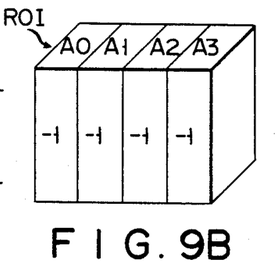
Figure 10A:
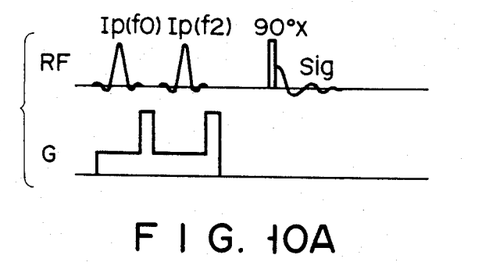
Figure 10B:
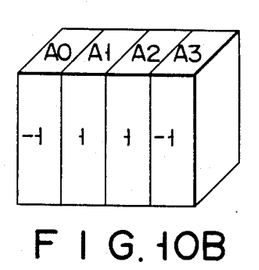
Figure 11A:
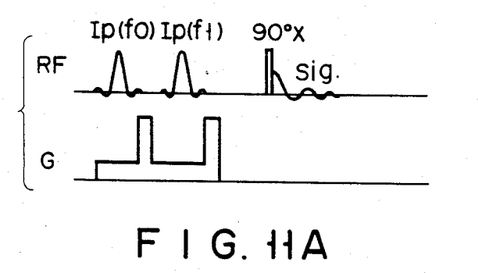
Figure 11B:
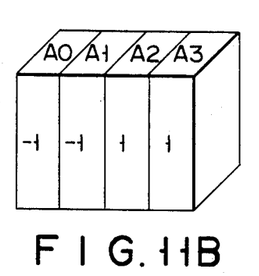
Figure 12A:
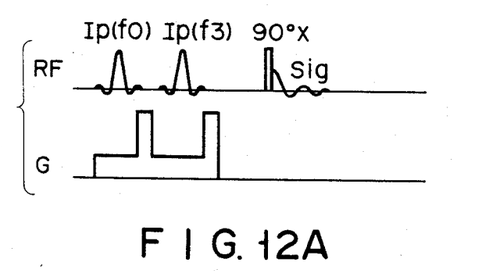
Figure 12B:
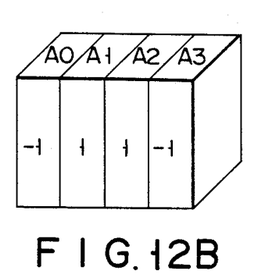

FIG. 7A shows signal components included in the first column of the inverse Hadamard transform signal matrix D in equation (8). Ideally, these signal components are constituted by only components from the area A0. However, the selection characteristics, i.e., the sensitivity characteristics to positions, of a sinc waveform used as a selective inversion pulse is not represented by an ideal rectangular shape indicated by a broken line in FIG. 8 but is represented by a solid line in FIG. 8. As described above, since the selection characteristics of a selective inversion pulse are not sufficiently good, signal components from other areas A1, A2, ... are included. FIG. 7B shows signal components included in the second column of the MR signal matrix D. As shown in FIG. 7B, signal components from areas other than the area A1 are slightly included because of the influences of inverted magnetization of areas other than the area A1.

An MR apparatus according to a second embodiment of the present invention will be described below. In this embodiment, an MR signal matrix (represented by SN) obtained by inverting the magnetization of local areas corresponding to "−1" of an Hadamard matrix using selective inversion pulses as shown in FIGS. 9A to 12B is subtracted from the MR signal matrix (represented by SP) obtained by inverting the magnetization of the local areas corresponding to "−1" of the Hadamard matrix H as described with reference to FIG. 3A to 6B. Subsequently, the inverse Hadamard transform of an obtained differential signal matrix SP-SN is performed as in equation (9):

$$\begin{aligned} D &= H^{-1} \cdot S \\ &= H^{-1}(SP - SN) \\ &= DP - DN \end{aligned} \quad (9)$$

where $DP = H^{-1} \cdot SP$
$DN = H^{-1} \cdot SN$

Figure 13A:
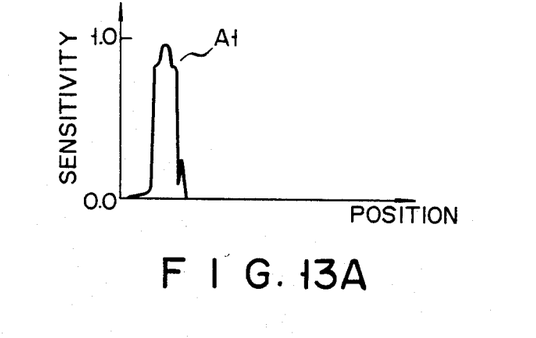
FIGS. 13A to 13C are graphs showing simulating results of detection sensitivities of MR signals from the respective local areas in the sequences in FIGS. 9A, 10A, 11A, and 12A.
Figure 13B:
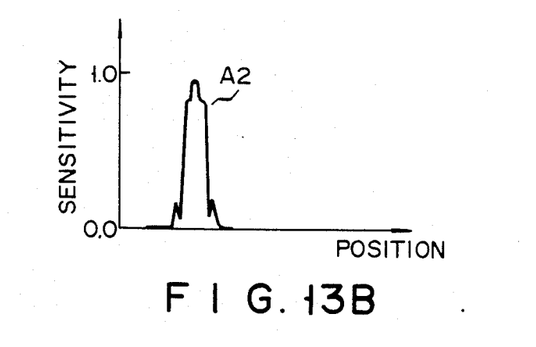
Figure 13C:
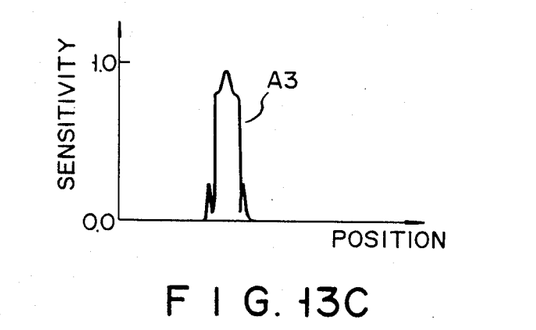

In this case, the signs of signals from the areas A1 to A3 corresponding to DP and DN are opposite to each other, but the signs of signals from other areas are the same. For this reason, if DP-DN, signals from the areas A0 to A3 are respectively added to each other, and signals from other areas are subtracted from each other to become zero. According to this embodiment, therefore, selection characteristics with respect to the areas A0 to A3 are improved. FIGS. 13A to 13C show selection characteristics with respect to the areas A1 to A3. Similar to the above-described case, the results obtained by the Hadamard transform are transformed by the inverse Fourier transform.

FIGS. 13A to 13C respectively show the detection sensitivities of MR signals detected from the areas A1, A2, and A3. Similar to FIGS. 7A to 7C, FIGS. 13A to 13C show the simulation results of detection sensitivities of MR signals. FIGS. 13B and 13C show signal components from the areas A2 and A3 in which almost no signal component from other areas is included.

Figure 14:
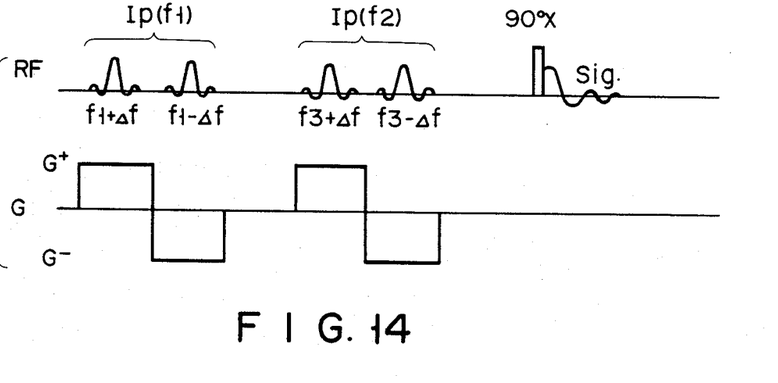
FIG. 14 is a graph for explaining a sequence of a high-frequency field and a gradient field for MR signal acquisition in an MR apparatus according to a third embodiment of the present invention.

FIG. 14 shows high-frequency fields and the application sequence of a gradient field in an MR apparatus according to a third embodiment of the present invention. In this system, a first selective excitation pulse having a frequency higher than a desired center frequency by a predetermined value and a second selective excitation pulse having a frequency lower than the center frequency by a predetermined value are used as selective inversion pulses. For example, a selective inversion pulse Ip(f1) consists of a pair of selective excitation pulses respectively having frequencies of f1+Δf and f1−Δf. With regard to a gradient field G, when the first excitation pulse is applied, for example, a positive gradient field pulse G+ is applied, whereas when the second excitation pulse is applied, a negative gradient field pulse G− is applied.

In this case, the magnetization of each local area is rotated through 90° twice, and hence is finally rotated through 180° (inverted). With this operation, disturbance of spin due to the gradient field is canceled, selectivity of a selective inversion pulse with respect to a local area can be further improved.

Figure 15A:
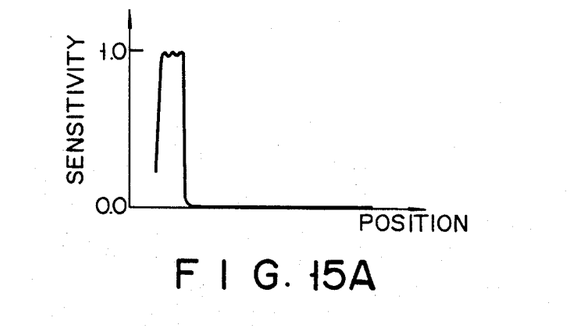
FIGS. 15A to 15C are graphs showing simulation results of the detection sensitivities of MR signals from the respective local areas in the sequence in FIG. 14.
Figure 15B:
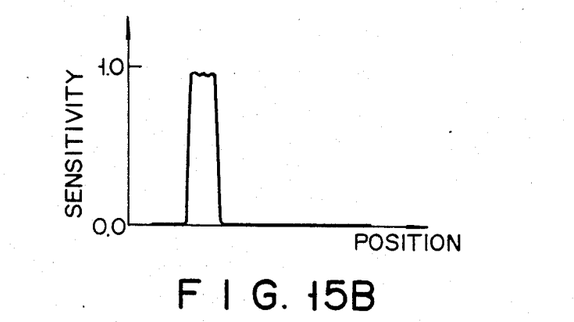
Figure 15C:
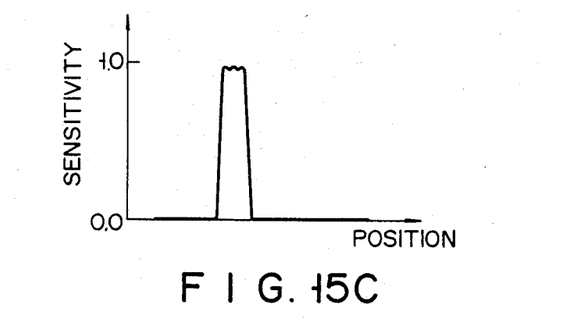

FIGS. 15A to 15C show the simulation results of detection sensitivities of MR signals from the three areas A1, A2, and A3 in this embodiment. It is apparent from FIGS. 15A to 15C that detection sensitivity distributions in the respective areas are uniformed, and hence the selectivity is further improved. Note that the method for selective inversion shown in FIG. 14 can be combined with either of the methods of the two embodiments described above.

Figure 16A:
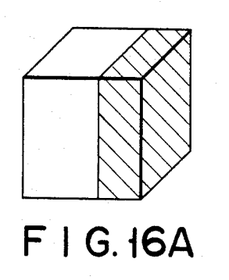
FIGS. 16A to 16E are views showing a selective saturation process for three-dimensional positioning of a rod-like area of interest according to a fourth embodiment of the present invention.
Figure 16B:
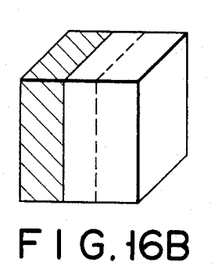
Figure 16C:
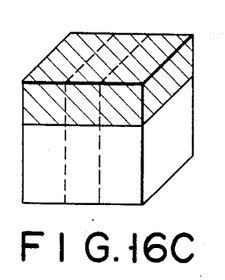
Figure 16D:
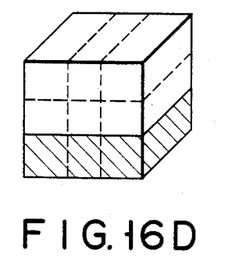
Figure 16E:
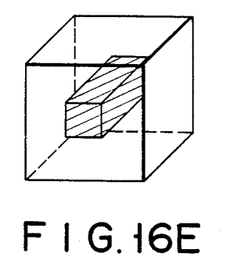

In each embodiment described above, acquisition of MR signals from the rod-like area of interest is exemplified. In view of clinical treatments, however, this rod-like area of interest must be three-dimensionally positioned, and MR signals must be acquired from the three-dimensional area of interest. According to a fourth embodiment of the present invention, in order to satisfy such a requirement, spins in hatched areas shown in FIGS. 16A to 16D are seemingly saturated by applying, e.g., selective saturation pulses so as to substantially cancel the magnetization of areas other than a hatched rod-like area (region of interest) shown in FIG. 16E, and the sequences described in each embodiment are performed. By performing such an operation for a plurality of rod-like areas of interest, MR signals can be acquired from a three-dimensional area of interest.

The above-mentioned selective saturation pulse is, for example, a combination of a selective excitation pulse as a high-frequency field and a spoiling gradient field pulse for saturating magnetization excited by the selective excitation pulse.

What is claimed is:

1. A magnetic resonance apparatus comprising:
signal acquiring means for obtaining a magnetic resonance signal matrix by repeating a series of sequences a plurality of times, the sequences including (a) applying a gradient field to an object to be examined which is placed in a uniform static field, and at the same time executing a selective inversion pulse application sequence for sequentially applying a plurality of selective inversion pulses having different frequencies as high-frequency fields onto the object, (b) applying a non-selective excitation pulse as a high-frequency field to the object without application of a gradient field, and (c) acquiring a magnetic resonance signal generated upon application of the non-selective excitation pulse, while the number and frequencies of selective inversion pulses are sequentially selected to cause a magnetization vector of a nuclear spin of an area corresponding to one of "−1" and "1" of an Hadamard matrix to be inverted by the selective inversion pulse application sequence; and
signal processing means for obtaining chemical shift information by transforming the magnetic resonance signal matrix obtained by said signal acquiring means in an aligning direction of the magnetic resonance signal matrix by an inverse Hadamard transform, and transforming the transformed magnetic resonance signal matrix in a time base direction by an inverse Fourier transform.

2. An apparatus according to claim 1, wherein the gradient field includes a spoiling gradient field pulse for canceling transverse magnetization after each of selective inversion pulses is applied.

3. A magnetic resonance apparatus comprising:
first signal acquiring means for obtaining a magnetic resonance signal matrix by repeating a series of sequences a plurality of times, the sequences including (a) applying a gradient field to an object to be examined which is placed in a uniform static field, and at the same time executing a selective inversion pulse application sequence for sequentially applying a plurality of selective inversion pulses having different frequencies as high-frequency fields onto the object, (b) applying a non-selective excitation pulse as a high-frequency field to the object without application of a gradient field, and (c) acquiring a magnetic resonance signal generated upon application of the non-selective excitation pulse, while the number and frequencies of selective inversion pulses are sequentially selected to cause a magnetization vector of a nuclear spin of an area corresponding to "−1" of an Hadamard matrix to be inverted by the selective inversion pulse application sequence;
second signal acquiring means for obtaining a magnetic resonance signal matrix by repeating the series of sequences while sequentially selecting the number and frequencies of selective inversion pulses so as to cause a magnetization vector of an area corresponding to "1" of the Hadamard matrix to be inverted by the selective inversion pulse application sequence; and means for obtaining chemical shift information by obtaining a differential signal matrix based on a difference between magnetic resonance matrices respectively obtained by said first and second signal acquiring means, transforming the differential signal matrix in an aligning direction thereof by an inverse Hadamard transform, and transforming the transformed matrix in a time base direction by an inverse Fourier transform.

4. An apparatus according to claim 3, wherein the gradient field includes a spoiling gradient field pulse for canceling transverse magnetization after each of selective inversion pulses is applied.

5. A magnetic resonance apparatus comprising:

signal acquiring means for obtaining a magnetic resonance signal matrix by repeating a series of sequences a plurality of times, the sequences including (a) applying a gradient field to an object to be examined which is placed in a uniform static field, and at the same time executing a selective inversion pulse application sequence for sequentially applying a plurality of selective inversion pulses having different frequencies as high-frequency fields onto the object, each of the selective inversion pulses consisting of a pair of a first selective excitation pulse having a frequency higher than a desired center frequency by a predetermined value and a second selective excitation pulse having a frequency lower than the center frequency by a predetermined value, and the gradient field consisting of a pair of a first gradient field pulse having a predetermined polarity to be simultaneously applied with the first selective excitation pulse and a second gradient field having a polarity opposite to that of the first gradient field pulse, (b) applying a non-selective excitation pulse as a high-frequency field to the object without application of a gradient field, and (c) acquiring a magnetic resonance signal generated upon application of the non-selective excitation pulse, while the number and frequencies of selective inversion pulses are sequentially selected to cause a magnetization vector of a nuclear spin of an area corresponding to one of "−1" and "1" of an Hadamard matrix to be inverted by the selective inversion pulse application sequence; and signal processing means for obtaining chemical shift information by transforming the magnetic resonance signal matrix obtained by said signal acquiring means in an aligning direction of the magnetic resonance signal matrix by an inverse Hadamard transform, and transforming the transformed magnetic resonance signal matrix in a time base direction by an inverse Fourier transform.

6. A magnetic resonance apparatus comprising:

first signal acquiring means for obtaining a magnetic resonance signal matrix by repeating a series of sequences a plurality of times, the sequences including (a) applying a gradient field to an object to be examined which is placed in a uniform static field, and at the same time executing a selective inversion pulse application sequence for sequentially applying a plurality of selective inversion pulses having different frequencies as high-frequency fields onto the object, each of the selective inversion pulses consisting of a pair of a first selective excitation pulse having a frequency higher than a desired center frequency by a predetermined value and a second selective excitation pulse having a frequency lower than the center frequency by a predetermined value, and the gradient field consisting of a pair of a first gradient field pulse having a predetermined polarity to be simultaneously applied with the first selective excitation pulse and a second gradient field having a polarity opposite to that of the first gradient field pulse, (b) applying a non-selective excitation pulse as a high-frequency field to the object without application of a gradient field, and (c) acquiring a magnetic resonance signal generated upon application of the non-selective excitation pulse, while the number and frequencies of selective inversion pulses are sequentially selected to cause a magnetization vector of a nuclear spin of an area corresponding to "−1" of an Hadamard matrix to be inverted by the selective inversion pulse application sequence;

second signal acquiring means for obtaining a magnetic resonance signal matrix by repeating the series of sequences while sequentially selecting the number and frequencies of selective inversion pulses so as to cause a magnetization vector of an area corresponding to "1" of the Hadamard matrix to be inverted by the selective inversion pulse application sequence; and means for obtaining chemical shift information by obtaining a differential signal matrix based on a difference between magnetic resonance matrices respectively obtained by said first and second signal acquiring means, transforming the differential signal matrix in an aligning direction thereof by an inverse Hadamard transform, and transforming the transformed matrix in a time base direction by an inverse Fourier transform.

7. A magnetic resonance apparatus comprising:

saturating means for applying a selective saturation pulse to an object to be examined placed in a uniform static field so as to saturate magnetization of areas other than an area of interest in the object from which a magnetic resonance signal is to be acquired;

signal acquiring means for obtaining a magnetic resonance signal matrix by repeating a series of sequences a plurality of times, the sequences including (a) applying a gradient field to the object, and at the same time executing a selective inversion pulse application sequence for sequentially applying a plurality of selective inversion pulses having different frequencies as high-frequency fields onto the object, (b) applying a non-selective excitation pulse as a high-frequency field to the object without application of a gradient field, and (c) acquiring a magnetic resonance signal generated upon application of the non-selective excitation pulse, while the number and frequencies of selective inversion pulses are sequentially selected to cause a magnetization vector of a nuclear spin of an area corresponding to one of "−1" and "1" of an Hadamard matrix to be inverted by the selective inversion pulse application sequence; and signal processing means for obtaining chemical shift information by transforming the magnetic resonance signal matrix obtained by said signal acquiring means in an aligning direction of the magnetic resonance signal matrix by an inverse Hadamard transform, and transforming the transformed magnetic resonance signal matrix in a time base direction by an inverse Fourier transform.

8. An apparatus according to claim 7, wherein the selective saturation pulse includes a selective excitation pulse as a high-frequency field, and a spoiling gradient field pulse for saturating magnetization upon application of the selective excitation pulse.

9. A magnetic resonance apparatus comprising:

saturating means for applying a selective saturation pulse to an object to be examined placed in a uniform static field so as to saturate magnetization of areas other than an area of interest in the object from which a magnetic resonance signal is to be acquired;

first signal acquiring means for obtaining a magnetic resonance signal matrix by repeating a series of sequences a plurality of times, the sequences including (a) applying a gradient field to the object, and at the same time executing a selective inversion pulse application sequence for sequentially applying a plurality of selective inversion pulses having different frequencies as high-frequency fields onto the object, (b) applying a non-selective excitation pulse as a high-frequency field to the object without application of a gradient field, and (c) acquiring a magnetic resonance signal generated upon application of the non-selective excitation pulse, while the number and frequencies of selective inversion pulses are sequentially selected to cause a magnetization vector of a nuclear spin of an area corresponding to "−1" of an Hadamard matrix to be inverted by the selective inversion pulse application sequence;

second signal acquiring means for obtaining a magnetic resonance signal matrix by repeating the series of sequences while sequentially selecting the number and frequencies of the selective inversion pulses so as to cause a magnetization vector of an area corresponding to "1" of the Hadamard matrix to be inverted by the selective inversion pulse application sequence; and means for obtaining chemical shift information by obtaining a differential signal matrix based on a difference between magnetic resonance matrices respectively obtained by said first and second signal acquiring means, transforming the differential signal matrix in an aligning direction thereof by an inverse Hadamard transform, and transforming the transformed matrix in a time base direction by an inverse Fourier transform.

10. An apparatus according to claim 9, wherein the selective saturation pulse includes a selective excitation pulse as a high-frequency field, and a spoiling gradient field pulse for saturating magnetization upon application of the selective excitation pulse.

11. A magnetic resonance apparatus comprising:

saturating means for applying a selective saturation pulse to an object to be examined placed in a uniform static field so as to saturate magnetization of areas other than an area of interest in the object from which a magnetic resonance signal is to be acquired;

signal acquiring means for obtaining a magnetic resonance signal matrix by repeating a series of sequences a plurality of times, the sequences including (a) applying a gradient field to the object, and at the same time executing a selective inversion pulse application sequence for sequentially applying a plurality of selective inversion pulses having different frequencies as high-frequency fields onto the object, each of the selective inversion pulses consisting of a pair of a first selective excitation pulse having a frequency higher than a desired center frequency by a predetermined value and a second selective excitation pulse having a frequency lower than the center frequency by a predetermined value, and the gradient field consisting of a pair of a first gradient field pulse having a predetermined polarity to be simultaneously applied with the first selective excitation pulse and a second gradient field having a polarity opposite to that of the first gradient field pulse, (b) applying a non-selective excitation pulse as a high-frequency field to the object without application of a gradient field, and (c) acquiring a magnetic resonance signal generated upon application of the non-selective excitation pulse, while the number and frequencies of selective inversion pulses are sequentially selected to cause a magnetization vector of a nuclear spin of an area corresponding to one of "−b 1" and "1" of an Hadamard matrix to be inverted by the selective inversion pulse application sequence; and signal processing means for obtaining chemical shift information by transforming the magnetic resonance signal matrix obtained by said signal acquiring means in an aligning direction of the magnetic resonance signal matrix by an inverse Hadamard transform, and transforming the transformed magnetic resonance signal matrix in a time base direction by an inverse Fourier transform.

12. An apparatus according to claim 11, wherein the selective saturation pulse includes a selective excitation pulse as a high-frequency field, and a spoiling gradient field pulse for saturating magnetization upon application of the selective excitation pulse.

13. A magnetic resonance apparatus comprising:

saturating means for applying a selective saturation pulse to an object to be examined placed in a uniform static field so as to saturate magnetization of areas other than an area of interest in the object from which a magnetic resonance signal is to be acquired;

first signal acquiring means for obtaining a magnetic resonance signal matrix by repeating a series of sequences a plurality of times, the sequences including (a) applying a gradient field the object, and at the same time executing a selective inversion pulse application sequence for sequentially applying a plurality of selective inversion pulses having different frequencies as high-frequency fields onto the object, each of the selective inversion pulses consisting of a pair of a first selective excitation pulse having a frequency higher than a desired center frequency by a predetermined value and a second selective excitation pulse having a frequency lower than the center frequency by a predetermined value and the gradient field consisting of a pair of a first gradient field pulse having a predetermined polarity to be simultaneously applied with the first selective excitation pulse and a second gradient field having a polarity opposite to that of the first gradient field pulse, (b) applying a non-selective excitation pulse as a high-frequency field to the object without application of a gradient field, and (c) acquiring a magnetic resonance signal generated upon application of the non selective excitation pulse, while the number and frequencies of selective inversion pulses are sequentially selected to cause a magnetization vector of a nuclear spin of an area corresponding to "−1" of an Hadamard matrix to be inverted by the selective inversion pulse application sequence;

second signal acquiring means for obtaining a magnetic resonance signal matrix by repeating the series of sequences while sequentially selecting the number and frequencies of the selective inversion pulses so as to cause a magnetization vector of an area corresponding to "1" of the Hadamard matrix to be inverted by the selective inversion pulse application sequence; and means for obtaining chemical shift information by obtaining differential signal matrix based on a difference between magnetic resonance matrices respectively obtained by said first and second signal acquiring means, transforming the differential signal matrix in an aligning direction thereof by an inverse Hadamard transform, and transforming the transformed matrix in a time base direction by an inverse Fourier transform.

14. An apparatus according to claim 13, wherein the selective saturation pulse includes a selective excitation pulse as a high-frequency field, and a spoiling gradient field pulse for saturating magnetization upon application of the selective excitation pulse.

* * * * *